United States Patent [19]
Sichmann

[11] Patent Number: 6,096,180
[45] Date of Patent: *Aug. 1, 2000

[54] CATHODIC SPUTTERING DEVICE

[75] Inventor: Eggo Sichmann, Geinhausen, Germany

[73] Assignee: Singulus Technologies AG, Alzenau, Germany

[ * ] Notice: This patent is subject to a terminal disclaimer.

[21] Appl. No.: 09/171,192

[22] PCT Filed: Apr. 14, 1997

[86] PCT No.: PCT/EP97/01871

§ 371 Date: May 26, 1999

§ 102(e) Date: May 26, 1999

[87] PCT Pub. No.: WO97/39161

PCT Pub. Date: Oct. 23, 1997

[30] Foreign Application Priority Data

Apr. 13, 1996 [DE] Germany ............................ 196 14 598

[51] Int. Cl.[7] .................................................. C23C 14/00
[52] U.S. Cl. ............................... 204/298.18; 204/298.02; 204/298.12; 204/298.16; 204/298.17; 204/298.21
[58] Field of Search ......................... 204/298.02, 298.12, 204/298.16, 298.17, 298.18, 298.21

[56] References Cited

U.S. PATENT DOCUMENTS

| 4,100,055 | 7/1978 | Rainey ..................................... 204/298 |
| 4,282,083 | 8/1981 | Kertesz et al. ........................... 204/298 |
| 4,547,279 | 10/1985 | Kiyota et al. ............................ 204/298 |
| 5,133,850 | 7/1992 | Kukla et al. ......................... 204/298.12 |
| 5,421,978 | 6/1995 | Schuhmacher et al. ............ 204/298.09 |
| 5,463,020 | 10/1995 | Becker et al. ........................... 528/408 |
| 5,490,915 | 2/1996 | Bracher .............................. 204/298.18 |
| 5,538,603 | 7/1996 | Guo ................................... 204/192.12 |
| 5,688,381 | 11/1997 | Gruenenfelder et al. .......... 204/192.12 |
| 5,863,399 | 1/1999 | Sichmann ........................... 204/298.19 |
| 5,935,397 | 8/1999 | Masterson .......................... 204/298.12 |

FOREIGN PATENT DOCUMENTS

| 227 438 | 7/1987 | European Pat. Off. ......... H04J 37/34 |
| 297 779 | 1/1989 | European Pat. Off. ......... H01J 37/34 |
| 334 564 | 9/1989 | European Pat. Off. ......... H01J 37/34 |
| 393 957 | 10/1990 | European Pat. Off. ........ C23C 14/35 |
| 608 478 | 8/1994 | European Pat. Off. ........ C23C 14/35 |
| 2824289 | 12/1978 | Germany ....................... C23C 15/00 |
| 90 17 728 | 1/1992 | Germany ....................... C23C 14/35 |
| 43 15 023 | 11/1994 | Germany ....................... C23C 14/35 |
| 43 25 023 | 2/1995 | Germany ....................... C08G 65/06 |
| 29510381 | 10/1995 | Germany ........................ H01J 37/34 |
| 676 791 | 10/1995 | Germany ........................ H01J 37/34 |

*Primary Examiner*—Nam Nguyen
*Assistant Examiner*—Steven H. VerSteeg
*Attorney, Agent, or Firm*—Pillsbury Madison & Sutro

[57] ABSTRACT

A target for a cathode sputtering device for producing coatings on a substrate (27) by a sputtering cathode (2), which can be introduced into a vacuum chamber, the target having a center axis (44) and being dynamically balanced with respect to the center axis (44) and having a back surface (40) and a target surface (41), the target surface (41) being spaced from the back surface and being concave as a new target surface. The target surface (41) is formed by at least two concentric target surface portions which are inclined with respect to each other, the target surface portions including an outer, radially inwardly extending target surface portion (49, 76) enlarging conically away from the center axis in a direction away from the back surface, and an inner, radially outwardly extending target surface portion (78') narrowing conically toward the center axis in the direction away from the back surface. The target surface (41) has a radially outer edge delimited by an axially projecting edge (72) being inclined with respect to the center axis (44). A concentric target surface intermediate portion (50) extending in a plane perpendicular to the center axis (44) is provided between the outer target surface portion (49) and the axially projecting edge (72).

50 Claims, 3 Drawing Sheets

CATHODIC SPUTTERING DEVICE

This application is the national phase of international application PCT/EP97/01871 filed Apr. 14, 1997 which designated the U.S.

BACKGROUND OF THE INVENTION

The present invention relates to a device for cathode sputtering for producing coatings on a substrate by means of a sputtering cathode, which can be introduced into a vacuum chamber and has magnets or ring magnets, pole shoes and a target extending concentrically with the center axis of the sputtering cathode, and whose surface extends at least partially inclined with respect to the back of the target.

A device for cathode sputtering for the static coating of disk-shaped substrates by means of a plasma in a vacuum chamber with at least one opening, which can be closed from the outside by placing a sputtering cathode on it, is already known (DE 43 15 023 A1). An elastic vacuum seal ring and an annular anode are provided between the cathode and the chamber wall, which radially enclose the openings from the outside, wherein the anode has a flat contact surface on its side facing in the direction of the cathode. The known sputtering cathode consists of a disk-shaped ferromagnetic yoke and a cooling plate. A disk-shaped insulator is inserted between these two. The target to be sputtered is arranged in front of the cooling plate, while a ring magnet is inserted in a groove on the back of the cooling plate. A counter-magnetic field is generated by the ring magnet, which affects the path of the magnetic field lines. By means of this, the path of the magnetic field lines is given an approximately parallel or lens-shaped or convex form.

BRIEF SUMMARY OF THE INVENTION

In contrast thereto, it is an object of the present invention to arrange or design the target surface in such a way that the target yield is improved. This object is achieved by the features of the claims.

In achieving this object, the invention starts out from the basic idea of providing a specific target geometry which allows a longer service life. In particular, the target comprises an inclined raised edge on both the inner and outer edges of the sputtering surface in order to improve the electron enclosure.

In accordance with the invention, the object is achieved in that a target surface extending inclined with respect to the back surface of the target or at least part of this surface encloses an angle with the back surface of the target, and the target surface is located between further target surfaces also including an angle with the inclined extending target surface. Thus, the target yield can be optimized since the surface of the target takes a course being adapted to the magnetic field lines. This is also achieved in that due to the advantageous design of the target surface, the magnetic field lines take a flat course. The inclined extending surface on the target or the convex target surface causes the material to be focussed from a larger target to a smaller substrate. Due to the parallel course of the partial target surfaces, a material accumulation for the target is provided. To this end it is advantageous that the magnetic field is adapted to this target design, i.e. takes a course which is almost parallel with the target surface.

To this end it is advantageous that the target surface extending inclined with respect to the back surface of the target is located between target surfaces enclosing an angle with it, said angle having a value of more than 10°.

In a further development of the invention it is advantageous that the target surface extending inclined with respect to the back surface of the target is located between target surfaces enclosing an angle with it, said angle having a value between 10° and 40°, or between 15° and 40°, or between 20° and 40°, and that a dynamically balanced annular groove adjoins the inner end of the inclined extending target surface.

Moreover, according to a preferred embodiment of the solution according to the present invention, the inner end of the inclined extending target surface adjoins a dynamically balanced annular groove or V-shaped annular groove having an angle between 10° and 40°.

It is of particular importance for the present invention that the upper end being located in the area of the target surface makes a transition into an outwardly directed element or a sharp-edged nose.

In connection with the design and arrangement according to the invention it is advantageous that the nose encloses an angle which can have a value between 20° and 60° or between 25° and 55° or between 30° and 40° or between 38° and 44°.

It is furthermore advantageous that the V-shaped dynamically balanced annular groove encloses an angle having a value between 30° and 50°.

Moreover, it is advantageous that the width of the edge element having a nose is smaller than the width of the annular surface extending parallel with the back surface of the target or smaller than the width of the inclined extending surface.

To this end it is advantageous that the width $B_1$ is approximately twice as large as the width $B_2$ and twice as large as the width $B_3$.

Moreover, it is advantageous that the angle between the inclined extending surface and the front surface of the target has a value between 18° and 34° or between 20° and 32° or between 23° and 29° or of 26°.

It is also advantageous that in the area of the back surface of the target a second outer ring magnet having a larger diameter is provided besides the first inner ring magnet. By employing two ring magnets it is possible to achieve an increase in the magnetic field and simultaneously in a defined area of the cathode a flat surface path for the magnetic field lines with respect to the back surface of the target. An improved utilization of the target is assured by this.

To this end it is furthermore advantageous that the two ring magnets provided in the area of the back surface of the target are arranged on the same transverse plane, and that the inner ring magnet is provided in the area of the exterior circumference of the center mask or the center anode or a cooling finger, and the outer ring magnet in the edge area or in the area of the exterior circumference of the target.

In a further development of the invention it is advantageous that, besides the two inner ring magnets, a third ring magnet is provided. The third ring magnet surrounds the two ring magnets and adjoins a side or the bottom side of the yoke.

In accordance with a preferred embodiment of the invention, all ring magnets are mounted to be dynamically balanced with respect to the -enter axis of the target and the two inner ring magnets are provided in annular grooves situated in the cooling plate. The laterally disposed ring magnet generates the magnetic sputering field which penetrates the target.

In accordance with a further feature of the device according to the invention, the outer ring magnet is optionally provided in the area of the pole shoe diameter between the yoke and the upper part of the pole shoe, and the two inner ring magnets are optionally located inside the exterior diameter or the exterior circumference of the target.

It is furthermore advantageous to have the outer ring magnet at a larger distance from the back surface of the target than the two inner ring magnets, and that a fourth ring magnet is provided which encloses the exterior circumference of the target. By means of the installation of the additional double ring magnets, which can also be placed very close to the back surface of the target, the widest possible erosion ditch is created since the electrons are not being focussed on narrow areas or on a narrow annular groove. For this reason it is advantageous that a large horizontal component of the magnetic field is achieved, and a very short distance from the back of the target is achieved by installing the double ring magnets in the rear wall of the cooling plate. The target configuration and the pole shoe design are also of particular importance.

To this end it is advantageous that the thickness $D_1$ of the target at its outer edge area is greater than the thickness $D_2$ at the inner edge area of the target, and that an inclined extending target surface and a target surface extending parallel with the back of the target are provided between the inner and the outer edge areas of the target.

It is furthermore advantageous that the inclined extending target surface is provided in the inner edge area of the target, the parallel extending target surface is provided in the outer edge area of the target, and the inclined extending target surface and the parallel extending target surface are provided between inner and outer target elements protruding in the form of sharp edges.

In accordance with a further development of the device of the invention, a further option consists in that a ring-shaped flange element extending concentrically with the center axis is provided at the inner edge area of the target, which flange element is clamped between the surface of the cooling plate and the flange element of a cooling finger, which is fixedly or releasably connected with the target. Because of the advantageous design of the target with a flange-shaped element in connection with a cooling finger, which can be screwed in or fixed in place by means of screw elements, the target no longer needs to be bonded on, but can be easily replaced at any time as required.

Depending on the use, it is also possible that at least one ring magnet is provided in the area of the exterior circumference of the target below the ring magnets provided at the back of the target or in its area.

To this end it is furthermore advantageous that the ring magnet provided in the area of the exterior circumference of the target is provided slightly above the lower limit of the target surface, and that the ring magnet provided in the area of the exterior circumference of the target is provided slightly outside the lower limit of the target surface which extends parallel with the back surface of the target.

In a further development of the invention, it is advantageous that the ring magnet provided in the area of the exterior circumference of the target terminates slightly below or outside the lower limit of the pole shoes, that the ring magnet is disposed concentrically with respect to the center axis of the target and that the lower end of the pole shoe is at a greater distance from the back of the target than the lower end of the target or the target surface.

In this way it is assured that the lower part of the pole shoe is provided with an annular space or a chamber for housing the outer ring magnet, and that the lower part of the pole shoe toward the exterior circumference of the pole shoe consists of a pole shoe element which tapers in the form of a truncated pyramid.

It is of special importance for the present invention that the pole shoe element which tapers in the form of a truncated pyramid makes a transition into the flange element which is wider than the free-standing end of the pole shoe, and that the flange element of the pole shoe forms one chamber wall of the ring magnet.

In connection with the embodiment and arrangement according to the invention, it is advantageous that an angle ($\alpha$) is formed between the front face of the end of the pole shoe and the inclined extending lateral wall of the pole shoe element which tapers in the form of a truncated pyramid, which angle has a value between 10° and 50° or between 25° and 45°.

It is furthermore advantageous that the distance between the outer ring magnet and the lower end or front face of the target is about 20% to 40% of the thickness $D_1$ of the target. An optimal design of the target is achieved because of the inclined extending arrangement of the target and the adjoining parallel extending target surface, in particular if a non-ferromagnetic metal or aluminum target is employed as coating material, since because of the advantageous arrangement of the ring magnets, more material is sputtered off in the outer area of the target than in the inner area. This therefore provides an even use of the target.

Further advantages and details of the invention are described in the claims and the description and are shown in the Figures, wherein it is pointed out that all individual features and combinations of individual features are essential for the present invention.

DETAILED DESCRIPTION OF THE INVENTION

Figure 1:
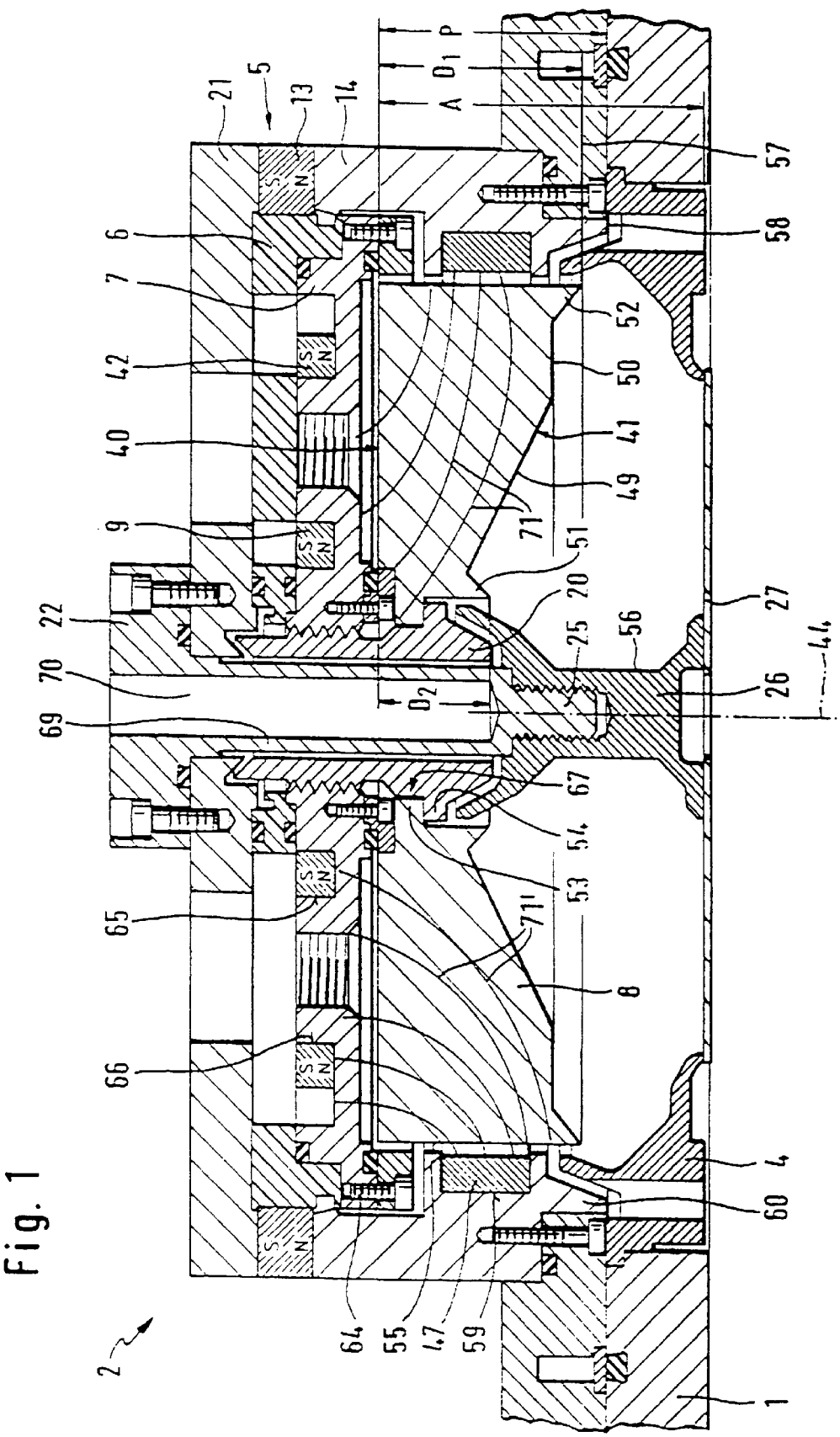
FIG. 1 is a cross-sectional view of a target with numerous concentrically arranged ring magnets.
Figure 2:
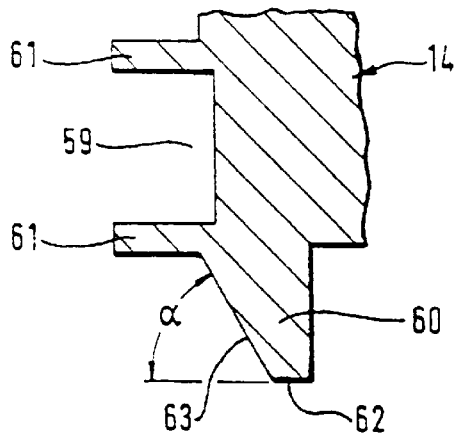
FIG. 2 is a partial view of the pole shoe according to FIG. 1, FIGS. 3–7 show further embodiments of targets with surfaces having a different design.

A cathode sputtering device for producing coatings on a substrate, e.g. a compact disk 27, is represented in FIG. 1. For performing the process, the sputtering cathode 2 can be installed in a chamber wall 1 of the cathode sputtering device. The cathode is composed of a disk-shaped ferromagnetic yoke 5 and a cooling plate 7. An insulator 6 is clamped between the yoke 5 and the cooling plate 7 and secured by means of threaded bolts.

A target 8 to be sputtered is arranged in front of the cooling plate 7. A ring-shaped, or annular, groove 66 and an annular groove 65 are also formed in the back of the cooling plate 7 for housing an inner ring magnet 9 and an outer ring magnet 42 which are arranged concentrically with respect to the center axis 44 of the target 8. The yoke 5, the insulator 6 and the cooling plate 7 are secured by means of a screw, which is not shown in the drawings. In an advantageous manner the screw is insulated against the yoke by means of an insulator. A cable connected with a sputter current supply device can be connected with the screw.

A further ring magnet 13 arranged concentrically with respect to the center axis 44 is located in the area of the exterior circumference of the cooling plate 7 or the insulator 6. The magnet 13 is embodied as a ferromagnet and therefore constitutes the complete magnetic field enclosure.

A pole shoe 14, which concentrically surrounds the insulator 6, the cooling plate 7 and the target 8, adjoins the ring magnet 13.

The lower part of the pole shoe forms a pole shoe element 60 in the form of a truncated pyramid, or cone, tapering downwardly or in the direction toward the vacuum chamber. The lower portion of pole shoe element 60 in the form of a truncated pyramid makes a transition into a ring-shaped flange element 61 which is wider than the free-standing end 62 of the pole shoe. The flange element 61 of the pole shoe 14 has the lateral wall 63 or the front face which is part of the pole shoe element in the form of a truncated cone. Two annular flanges 61 disposed at a distance from each other can be attached to the lower end of the pole shoe and form an annular chamber 59.

If a fourth ring magnet 47 is received concentrically with respect to the center axis 44, the annular flanges 61 may be omitted.

An angle α, which can have a value between 10° and 60°, or 20° and 50°, or 25° and 45°, and which affects the course of the magnetic field lines in an advantageous manner, is formed between the front face of the end 62 of the pole shoe 14 and the inclined extending lateral wall 63 of the pole shoe element 60 in the form of a truncated pyramid.

A bore 67 is located in the area of the center axis 44 of the sputtering cathode 2, which bore 67 extends through the entire device and is used to receive a hollow screw 20 which is pushed or screwed in place so that its lower flange element 54 bears against a flange element 53 provided on the target 8.

With a yoke plate 21, the yoke 5 adjoins the hollow screw 20 in the axial direction without contacting hollow screw 20.

A cooling head is fastened on the back of the yoke 5 by means of a flange 22 and extends in the axial direction through the yoke plate 21 as well as through the hollow screw 20 up to the front of the target and does not contact the hollow screw 20. The flange 22 of the cooling finger 69 with the cylindrical element adjoining it forms a cylindrical bore 70 for receiving a tube, not shown in the drawings, which is connected to a cooling water line.

A center mask or center anode 26 is releasably connected by means of a screw 25 to the front face or the lower end of the flange 22 of the cooling finger 69. The center anode 26 extends as far as the hollow center of the target 8 which is provided at the front of the target; the lower end of center anode 26 forms, together with an outer anode 4 or outer mask, an annular surface for masking the substrate 27.

As can be seen from FIG. 1, the screw 20 has the flange element 54 which pushes the flange element 53 provided at the target 8 against the front of the cooling plate 7. In this way the otherwise customary bonding of the target can be omitted, and it can easily be replaced. It is furthermore possible to connect the target with the cooling flange by means of screws.

As can be seen from FIG. 1, the two ring magnets 9 and 42 provided on the back of the target are arranged preferably in the same transverse plane. The inner ring magnet 9 is arranged in the area of the exterior circumference 56 of the center mask or center anode 26 or of the cooling finger 69 or closer toward the center axis 44 or in the area of the exterior circumference of the hollow-shaped screw 20 for receiving the cooling finger 69. The outer ring magnet 42 is situated in the edge area or in the area of the exterior circumference 55 of the target 8.

The ring magnet 13 is located slightly above the two ring magnets 9 and 42 and can be disposed on the yoke 5. The ring magnet 13 can be formed by numerous individual magnets arranged in a ring-shape.

Depending on the development of the target, which can be embodied, for example, as an aluminum target or a gold target, a fourth ring magnet 47 can be provided in the area of the lower end of the exterior circumference of the target 8.

All ring magnets 9, 13, 42 and 47 are mounted to be dynamically balanced about the center axis 44 of the target 8. In an advantageous manner, the two inner ring magnets 9 and 42 are also located inside the exterior diameter or exterior circumference 55 of the target 8.

As can be seen from FIG. 1, the outer ring magnet 13 is at a greater distance from the back of the target than are the two inner ring magnets 9 and 42.

If, for example, the target is embodied as an aluminum target, it is advantageous for the thickness $D_1$ of the target 8 at its outer edge 55 to be greater than the thickness $D_2$. By means of this, the target 8 is given an inclined extending target surface portion 49 in accordance with FIG. 1, and an adjoining target surface portion 50 extending parallel with the back of the target.

If an aluminum target is used and two double ring magnets are employed, the magnetic field is flattened at the back of the target, even with a very compact design (in this connection see the magnetic field lines 71 of the right-hand side of the target 8). If, for example, the two double magnets were omitted, the magnetic field lines 71' would take a very unfavorable course, i.e. they would enter the yoke 5 almost vertically. On the right-hand side of FIG. 1, the field lines 71 take a convex or flattened or approximately parallel course with respect to the back of the target. This is caused in an advantageous manner by the two double ring magnets 9 and 42 provided at the back of the target, which aid in the amplification of the field lines. Such an arrangement of the ring magnets 9 and 42 is particularly suitable in connection with a non-ferromagnetic metal target, for example an aluminum target. A very compact design of the entire device is achieved because of the double embodiment of the two ring magnets and the danger of a short circuit is ruled out to a large degree. Thus, the two ring or counter magnets 9 and 42 amplify the magnetic field lines so that they can take up the course shown on the right-hand side of FIG. 1.

As can be seen from FIG. 1, the distance A between the front face of the cooling plate 7 and the lower edge of the center mask and/or anode 26 is greater than the thickness $D_1$ of the target 8 or the distance P between the back 40 of the target and the sharp-edged, projecting pole shoe element 62.

A sharp-edged target element 51 located in the center or in the area of the center axis 44 is set back in relation to the exterior target element 52.

If, for example, a target with a low electron emission rate or a gold target is employed, it is advantageous if the magnetic field is amplified in the area of the target surface, because a gold target has a considerably different sputtering property than an aluminum target. The ring magnet 47 provided in the area of the exterior circumference of the target 8 and in the pole shoes 14 is situated in the area or slightly below the target surface 41 and is used for amplifying the magnetic field in the area of the target surface 41, so that with this arrangement, too, the magnetic field lines do not enter the yoke 5 vertically or approximately vertically. This relatively large magnet 47 lies in the direction of the main magnetic field and aids in the amplification of the magnetic flux. In this case the flanges or bars 61 of the pole shoe element 62 can be omitted.

Since a lesser electron emission occurs with gold sputtering, a clearly higher voltage of, for example, 2,000 V would be required without the relatively large ring magnet in the vicinity of the target surface 41 in order to provide an output worth mentioning. By means of the advantageous provision of the ring magnet 47, the magnetic field can be amplified and the plasma impedance reduced.

The ring magnets 9, 13, 42 shown in FIG. 1 are all polarized in the same direction, wherein North is directed downwardly, each with respect to the view of FIG. 1.

Figure 3:
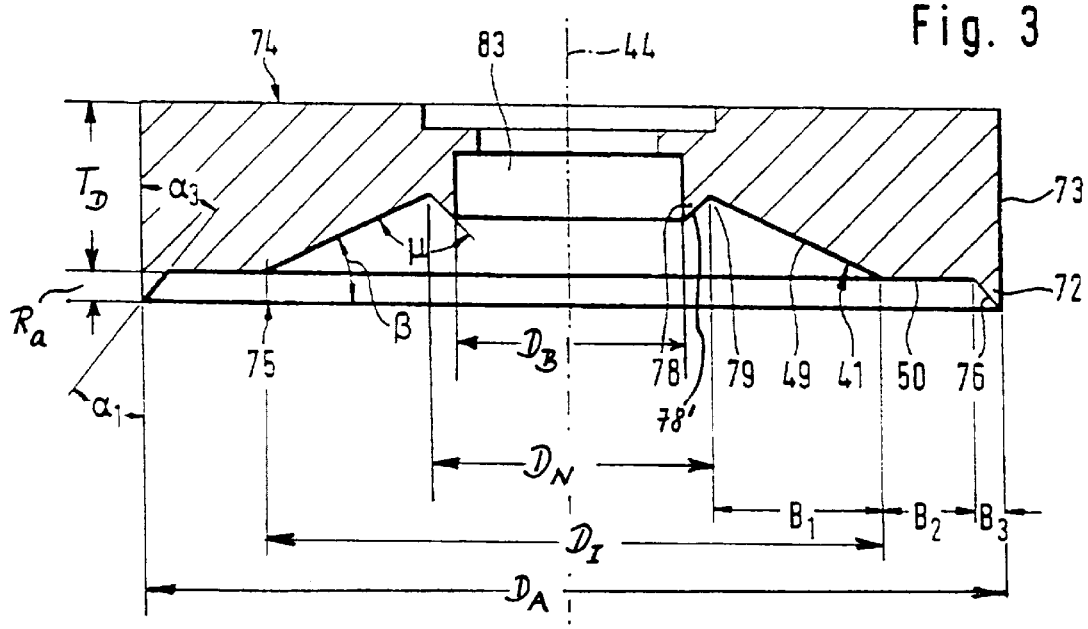
Figure 4:
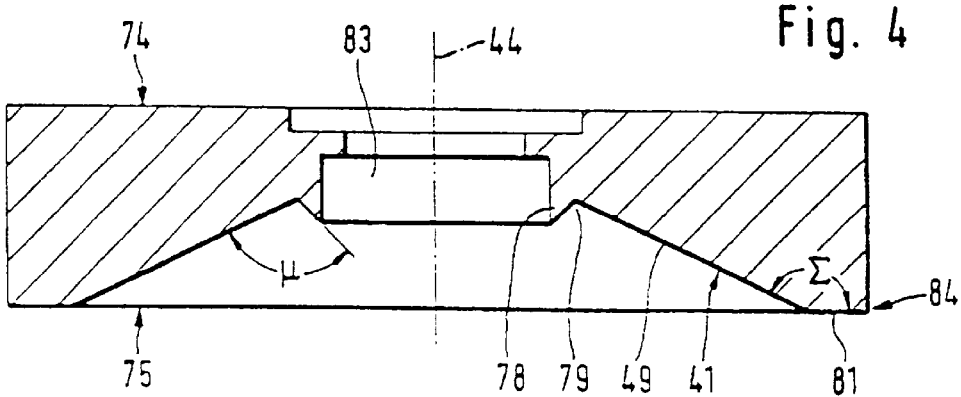
Figure 5:
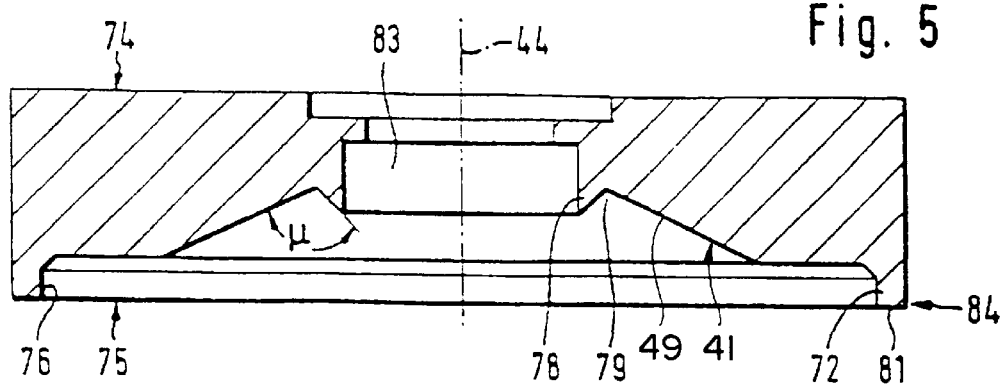
Figure 6:
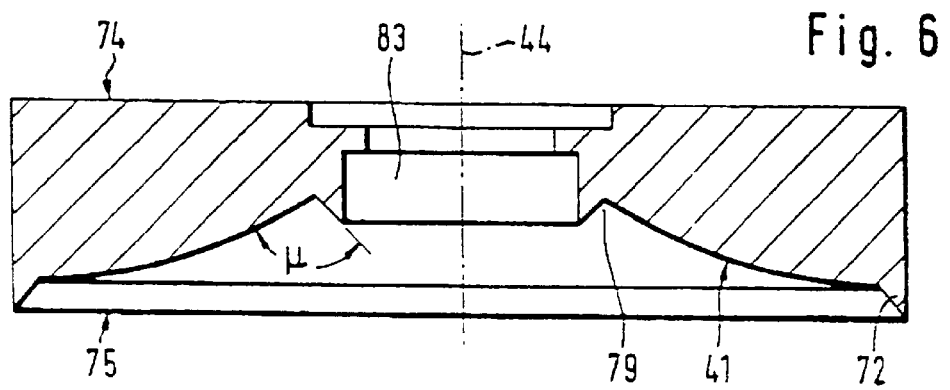

FIGS. 3 to 5 show different sputtering cathodes 2 with different target surfaces 41.

The magnetic field lines can be influenced by the arrangement of the ring magnets. A concentration of the magnetic field lines can, for example in the area of the target surface, be achieved by the two spaced, parallel flanges or bars 61 (FIG. 1). A wide erosion ditch can be achieved in that the magnetic field lines extend approximately parallel with the area of the back of the target. Therefore, it would be most advantageous if the magnetic field would adapt to the target surface in order to thus achieve a wide erosion ditch. To this end it is advantageous that in the edge area of the target sharp-edged edges or noses 72 are provided. The noses 72 can also have a rectangular cross-section with respect to the cross-section of the cathode, i.e. side 72 extends parallel with the edge portion 84 and right-angled with the target surface 82.

The sharp-edged edges or noses 72 include an angle $\alpha_1$ between the target surface 73 or its external circumference and the surface 76 of the nose 72, said angle having advantageously a value of 40°, however also between 20° and 60° or between 25° and 55° or between 30° and 55° or between 38° and 54° or also of 50°.

The nose 72 adjoins the small annular surface 50 extending vertical with respect to the center axis 44 of the target and being mounted to be dynamically balanced about the center axis 44, like the nose 72 also forming an annular element. This annular surface 50 is arranged closer to the front surface 75 of the target than to the back surface 74 of the target and makes a transition into the inclined extending surface 76 of the nose 72.

A further inclined extending target surface 41 adjoins the annular surface 50 and, together with the nose 72, forms an approximately concave annular surface and ends slightly in front of the center axis 44 or a central bore 83 of the target 2.

A sharp-edged nose 78 with a target surface portion 78' adjoins the inclined extending target surface 41 also in the direction of the front surface 75 of the target; together with the inwardly inclined extending target surface 41, said target surface portion 78 ' forms a V-shaped dynamically balanced annular groove 79 which encloses an angle $\mu$ having a value between 10° and 50°, preferably between 30° and 50°, or more than 90°, preferably 125°. A cone angel $\alpha_3$ between inner target surface portion 78' and the center axis 44 has a value between 20° and 70°, more preferably between 30° and 60°, and most preferably of 60°.

As can be seen in FIG. 3, the edge portion with the nose 72 has a width $B_3$ which is smaller than the width $B_2$ of the annular surface or the width $B_1$ of the inclined extending surface 49.

The width $B_1$ is approximately twice as large as the width $B_2$, and twice as large as the width $B_3$.

The angle β between the inclined extending surface 49 and the front surface 75 of the target has a value of 15° to 35°, preferably 20° to 32°, more preferably 23° to 29° and most preferably 25°.

The inner edge of the V-shaped annular groove 79 is located approximately in the center between the back surface 74 of the target and the front surface 75 of the target.

A particularly preferred target has the following dimensions (see FIG. 3):

target thickness (without outer edge 72) $T_D$=30 ±5 mm (distance back surface of target - plane target surface 50)

diameter of the border line between the target surface portions 49 and 50: $D_I$=102 ±5 mm cone angle of the target surface portion 49: β=25°±5°

In connection with the above, the following dimensions are also preferred:

external diameter of the target: $D_A$ =150 ±5 mm cone angle of the outer edge :$\alpha_1$=50°±5° raised edge (exterior) : $R_a$=3.8 ±0.2 mm groove diameter (groove 79) : $D_N$=47.8 ±0.5 mm groove angel (groove 79) : $\mu$=125° +5° center bore : diameter $D_B$=40 ±2 mm

Instead of the approximately stepped course of the front surface of the target or target surface 76, 50, 49, the outer nose 72 according to FIG. 3 can also be omitted and a small target surface 81 can be provided, wherein said small target surface 81 extends parallel with the back surface 74 of the target and one end of it adjoins an external circumference or edge portion 84 and the other end of it adjoins the inclined extending target surface 49 and encloses an angle Σ with it, said angle having a value between 120° and 160°.

Figure 7:
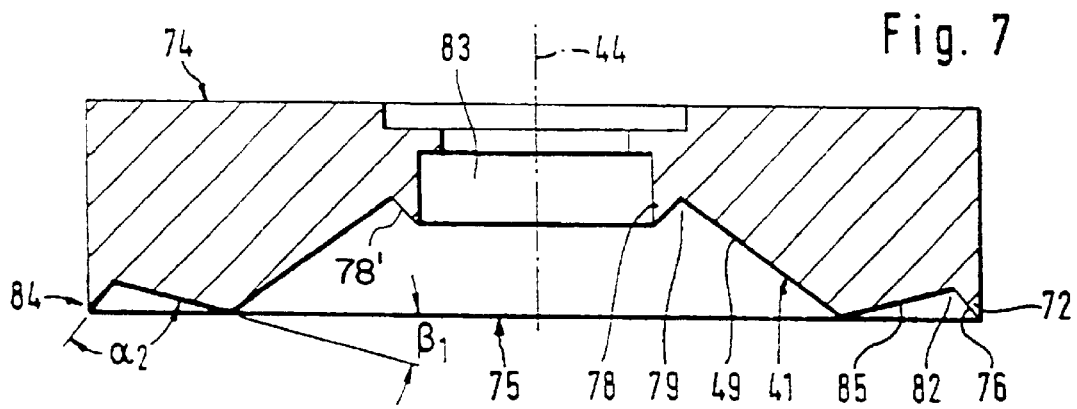

According to FIG. 7, the target surfaces 49, 85, 76 can also take a zigzag course, i.e. the nose 78 located at the inner area of the bore 83 of the target forms with the target surface portion 78' the first annular groove 79; the inclined extending target surface 49 adjoins said annular groove 79, and a second annular groove 82, which is formed by the surfaces 76 and 85, adjoins said inclined extending target surface 49. These surfaces 76, 85 enclose the angle $\alpha_2$ which can have a value between 70° and 175°, and/or the angle $\beta_1$ which can have a value between 5° and 50°, or 5° and 20°, or between 8° and 12°.

Figure 8:
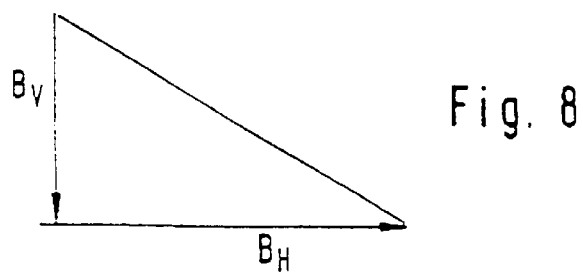
FIG. 8 shows vectors which make clear the electron emission.

Moreover, according to FIG. 5 it is possible that the inclined extending target surface 41 extends between the two noses 78 and 72 in a convex or concave manner. The circular target can also have an oval or oblong shape, wherein the arcs of the circle are connected by parallel extending target walls. By means of the sharp-edged or rectangular noses 72, as shown in FIG. 8, the electrons are deflected, i.e. in a right angle (see the vectors $B_H$, $B_V$ on the magnetic field line of FIG. 8). The horizontal component $B_H$ holds the electrons on the target surface and the vertical component $B_V$ holds the electrons in the lateral direction. Thus, the vectors in FIG. 8 show how large the amount of electrons is which are focussed on the target surface, or which electrons are accelerated back to the target.

| List of Reference Signs | |
|---|---|
| 1 | chamber wall |
| 2 | sputtering cathode |
| 4 | anode |
| 5 | yoke |
| 6 | insulator |
| 7 | cooling plate |
| 8 | target |
| 9 | ring magnet |
| 9' | ring magnet |
| 9" | ring magnet |
| 9'" | ring magnet |
| 10 | screw |
| 11 | cable |
| 12 | insulator |
| 13 | ring magnet |
| 14 | pole shoe |
| 15 | cooling ring, cooling body |
| 16 | cooling channel |
| 17 | screw |
| 18 | cooling water connection |
| 19 | cooling water connection |
| 20 | hollow screw, pole shoe (fastening device) |
| 21 | yoke plate |
| 22 | flange of the cooling finger |
| 23 | cooling water line |
| 24 | cooling water line |
| 25 | screw |
| 26 | center mask or center anode |
| 27 | substrate |
| 28 | groove |
| 29 | recess |
| 30 | chamber surface |
| 31 | lower surface |
| 32 | clamping ring |
| 33 | anode ring |
| 40 | back surface of the target |
| 41 | target surface |
| 42 | ring magnet |
| 43 | edge area or exterior circumference |
| 44 | center axis |
| 47 | fourth ring magnet |
| 48 | exterior circumference |
| 49 | inclined extending target surface |
| 50 | parallel extending target surface |
| 51 | sharp-edged projecting target element |
| 52 | sharp-edged projecting target element |
| 53 | flange element |
| 54 | flange element of the screw |
| 55 | exterior circumference of target (8) |
| 56 | exterior circumference of center mask (26) |
| 57 | lower limit of the target surface |
| 58 | below the lower limit of pole shoe (14) |
| 59 | in the lower area of the pole shoe (14), and space or chamber |
| 60 | truncated-pyramid pole shoe element |
| 61 | flange element of the pole shoe element or bar |
| 62 | free-standing end of the pole shoe |
| 63 | lateral wall of truncated-pyramid pole shoe end (60) |
| 64 | threaded bolt |
| 65 | annular groove |
| 66 | annular groove |
| 67 | bore |
| 68 | axial bore |
| 69 | cooling finger |
| 70 | bore |
| 71 | magnetic field lines |
| 71' | magnetic field lines |
| $D_1$ | thickness of target (8), exterior |
| $D_2$ | thickness of target (3), interior |
| A | distance 7–26 |
| P | distance 40–62 |

What is claimed is:

1. A target for a cathode sputtering device for producing coatings on a substrate (27) by means of a sputtering cathode (2), which can be introduced into a vacuum chamber, said target having a center axis (44) and being dynamically balanced with respect to the center axis (44) and having a back surface (40) and a target surface (41), the target surface (41) being spaced from the back surface and being concave as a new target surface, wherein (a) the target surface (41) is formed by at least two concentric target surface portions which are inclined with respect to each other, the target surface portions including an outer, radially inwardly extending target surface portion (49, 76) enlarging conically away from the center axis in a direction away from the back surface, and an inner, radially outwardly extending target surface portion (78') narrowing conically toward the center axis in the direction away from the back surface;

(b) the target surface (41) has a radially outer edge delimited by an axially projecting edge (72) being inclined with respect to the center axis (44); and (c) a concentric target surface intermediate portion (50) extending in a plane perpendicular to the center axis (44) is provided between the outer target surface portion (49) and the axially projecting edge (72).

2. The target according to claim 1, wherein, between the inner target surface portion (78') and the center axis (44) there is formed a cone angle $\alpha_3$ having a value between 10° and 80°.

3. The target according to claim 2 wherein the cone angle $\alpha_3$ has a value between 20° and 70°.

4. The target according to claim 2 wherein the cone angle $\alpha_3$ has a value between 30° and 60°.

5. The target according to claim 2 wherein the cone angle $\alpha_3$ has a cone angle of 60°.

6. The target according to claim 1 wherein the target has a front surface (75) which lies in a plane that is perpendicular to the center axis (44), and further wherein between the outer target surface portion (49) and the plane there is formed a cone angle $\beta$ having a value of 15° to 35°.

7. The target according to claim 6, wherein the axially projecting edge (72) forms a cone angle $\alpha_1$ with respect to the center axis (44).

8. The target according to claim 7, wherein the cone angle $\alpha_1$ of the axially projecting edge (72) has a value between 20° and 60°.

9. The target according to claim 8 wherein the cone angle $\beta_1$ has a value between 25° and 55°.

10. The target according to claim 8 wherein the cone angle $\alpha_1$ has a value of 50°.

11. The target according to claim 6 wherein the cone angle $\beta$ has a value of 20° to 32°.

12. The target according to claim 6 wherein the cone angle $\beta$ has a value of 23° to 29°.

13. The target according to claim 6 wherein the cone angle $\beta$ has a value of 25°.

14. The target according to claim 1, wherein the outer target surface portion (49) is inclined to enclose an angle $\Sigma$ having a value greater than 10° with respect to the back surface (40) of the target an angle $\mu$ having a value greater than 10° with respect to the inner target surface portion (78').

15. The target according to claim 14, wherein the outer target surface portion (49) is located between the inner target surface portion (78') and the axially projecting edge (72), the angle $\Sigma$ has a value between 120° and 160° and the angle $\mu$ has a value greater than 90°.

16. The target according to claim 15 wherein the angle $\mu$ has a value of 125°.

17. The target according to claim 1 wherein the target surface (41) has a radially inner end provided with a dynamically balanced annular groove (79).

18. The target according to 1, wherein the projecting edge (72) has a radial width $B_3$, the target surface intermediate portion (50) has a radial width $B_2$ that is greater than the radial width $B_3$, and the outer target surface portion (49) has a radial width $B_1$ greater than the radial width $B_3$.

19. The target according to claim 18, wherein the radial width $B_1$ is approximately twice as large as the radial width $B_2$, and twice as large as the radial width $B_3$.

20. The target according to claim 1, wherein the target surface has a radially inner edge and, in a direction between the back surface and the target surface, the target has a thickness $D_1$ at the radially outer edge and thickness $D_2$ at the radially inner edge, thickness $D_1$ is greater than thickness $D_2$.

21. The target according to claim 1, wherein the outer target surface portion (49) is spaced radially inwardly from the target surface intermediate portion (50).

22. The target according to claim 1, wherein the outer target surface portion (49) and the target surface intermediate portion (50) are provided between inner and outer axially projecting edges (51, 52; 78, 72) of the target surface.

23. A cathode sputtering device for producing coatings on a substrate (27) by means of a sputtering cathode (2), which can be introduced into a vacuum chamber, comprising: a target according to claim 1, wherein the target has an exterior circumference (55); at least one first ring magnet (9 or 13) located adjacent the back surface (40) of the target; and at least one second ring magnet (47) disposed adjacent the exterior circumference (55) and below the first ring magnet (9 or 13).

24. The device according to claim 23, wherein the target surface has a lower limit (57) and the second ring magnet (47) is located slightly above or below the lower limit (57).

25. The device according to claim 24, wherein the lower limit (57) extends parallel to the back surface (40) and the second ring magnet (47) is located slightly below or outside the lower limit (57).

26. The device according to claim 23, further comprising pole shoes (14) having a lower limit (58), and wherein the second ring magnet (47) ends slightly below or outside the lower limit ( 58) of the pole shoes (14).

27. The device according to claim 23, wherein the second ring magnet (47) extends concentrically with the center axis (44) of the target.

28. The device according to claim 23, farther comprising a pole shoe (14) having a lower limit (58) and wherein the target surface has a lower limit (57) and the lower limit (58). of the pole shoe (14) is at a greater distance P from the back surface (40) of the target than is the lower limit (58) of the target surface.

29. The device according to claim 23, further comprising a pole shoe (14) having a lower area provided with an annular space or chamber ( 59) or two spaced apart flanges or bars (61).

30. The device according to claim 23, further comprising a pole shoe (14) having a lower portion and an exterior circumference, and wherein the lower portion of the pole shoe (14) extends to the exterior circumference of the pole shoe (14) and consists of a pole shoe element (60) which tapers to form a truncated pyramid.

31. The device according to claim 30, wherein the pole shoe element (60) has a freestanding end (62), the pole shoe (14) has a flange element (61) which makes a transition into the pole shoe element (60), and the flange element (61) is wider than the freestanding end (62) of the pole shoe (14).

32. The device according to claim 31, wherein the flange element (61) of the pole shoe (14) extends parallel with the back surface (40) of the target.

33. The device according to claim 23, farther comprising a pole shoe (14) having a lower portion and an exterior circumference, and wherein the lower portion of the pole shoe (14) extends to the exterior circumference of the pole shoe (14) and consists of a pole shoe element (60) which has a freestanding end (62) having a front face, and the pole shoe element (60) further has an inclined extending lateral wall (63) which tapers to form a truncated pyramid, and farther wherein the front face of the freestanding end (62) of the pole shoe (14) and the inclined extending lateral wall (63) enclose an angle $\alpha$ having a value between 10° and 60°.

34. The device according to claim 33 wherein the angle a has a value between 20° and 50°.

35. The device according to claim 33 wherein the angle a has a value between 25° and 45°.

36. The device according to claim 23, further comprising a pole shoe (14) having a lower portion and an exterior circumference, and wherein the lower portion of the pole shoe (14) extends to the exterior circumference of the pole shoe (14) and consists of a pole shoe element (60) which has an inclined extending lateral wall (63) which extends parallel to the axially projecting edge (72) of the target surface (41).

37. The device according to claim 23 wherein the at least one first ring magnet comprises an inner ring magnet (9) and an outer ring magnet (42) having a larger diameter than the inner ring magnet (9), the inner ring magnet and the outer ring magnet being disposed adjacent to the back surface (40) of the target.

38. The device according to claim 37, wherein the inner ring magnet and the outer ring magnet are arranged on a common transverse plane.

39. The device according to claim 37, further comprising en element constituted by one of: a center mask, or a center anode, or a cooling finger, the element having an exterior circumference (56) that is spaced radially inwardly from the target surface, and wherein the inner ring magnet (9) is located adjacent to the exterior circumference (56) of the element and the outer ring magnet (42) is located adjacent to the exterior circumference (55) of the target.

40. The device according to claim 37, further comprising a third ring magnet (13), which surrounds the inner ring magnet (9) and the outer ring magnet (42).

41. The device according to claim 40, further comprising a yoke (5) and wherein the third ring magnet (13) adjoins a side of the yoke (5).

42. The device according to claim 40, wherein the inner, outer and third ring magnets (9, 42, 13) are mounted to be dynamically balanced with respect to the center axis (44) of the target.

43. The device according to claim 37, further comprising a cooling plate (7) provided with annular grooves (65, 66) and wherein the inner ring magnet (9) and the outer ring magnet (42) are arranged in the annular grooves (65, 66).

44. The device according to claim 37, further comprising a pole shoe (14) having an upper portion and a yoke (5), and wherein the outer ring magnet (13) is aligned with the upper portion of a pole shoe (14) parallel to the center axis (44) and is disposed between the yoke (5) and the upper portion of the pole shoe (14).

45. The device according to claim 37, wherein the inner ring magnet (9) and the outer ring magnet (42) are located radially inwardly of the external circumference (55) of the target.

46. The device according to claim 37, further comprising a third ring magnet (13), which surrounds the inner ring magnet (9) and the outer ring magnet (42) and wherein the third ring magnet (13) is at a greater distance from the back surface (40) of the target than are the inner ring magnet and the outer ring magnet.

47. The device according to claim 37, further comprising a third ring magnet (13), which surrounds the inner ring magnet (9) and the outer ring magnet (42), and a fourth ring magnet (47) which surrounds the exterior circumference (55) of the target.

48. The device according to claim 23, further comprising a cooling plate (7) and a flange element (54) of a fastening device (20) connected with the target, and wherein the target has an inner edge area and further includes an annular flange element (53) extending concentrically with respect the center axis (44) and provided at the inner edge area of the target, said annular flange element (53) being clamped between the cooling plate (7) and the flange element (54) of the fastening device (20).

49. A target for a cathode sputtering device comprising an annular body having a center axis, an exterior cylinder surface, a back surface (40) perpendicular to the center axis (44) and a concave target surface (41) as a new target surface, wherein the target surface (41) is dynamically balanced with respect to the center axis and comprises:

(a) a conical target surface portion (49) which is inclined by an angle $\beta$ with respect to a plane (75) perpendicular to the center axis (44);

(b) an inner edge portion (78) having a truncated conical surface (78') that is inclined by an angle $\alpha_3$ with respect to the center axis and which adjoins the conical target surface portion (49) in order to form an essentially V-shaped groove (79); and (c) a target surface intermediate portion (50) extending in a plane perpendicular to the center axis (44) and making a transition into the conical target surface portion (49).

50. The target according to claim 49, wherein the target surface further comprises a conical edge portion (76) which is inclined by an angle $\alpha_1$ with respect to the center axis (44) and extends radially to the exterior cylinder surface, and the target surface intermediate portion (50) makes a transition into the conical edge portion (76).

* * * * *